US005604704A

United States Patent [19]
Atsumo

[11] Patent Number: 5,604,704
[45] Date of Patent: Feb. 18, 1997

[54] COMPOUND SEMICONDUCTOR STATIC RANDOM ACCESS MEMORY DEVICE EQUIPPED WITH PRECHARGING CIRCUIT CONTROLLED BY BOOSTED SIGNAL

[75] Inventor: Takao Atsumo, Tokyo, Japan

[73] Assignee: NEC Corporation, Japan

[21] Appl. No.: 450,381

[22] Filed: May 25, 1995

[30] Foreign Application Priority Data

May 30, 1994 [JP] Japan .................................. 6-116399

[51] Int. Cl.$^6$ ...................................................... G11C 7/00
[52] U.S. Cl. ................ 365/203; 365/189.09; 365/189.11
[58] Field of Search ............................. 365/203, 189.09, 365/189.11, 189.07

[56] References Cited

U.S. PATENT DOCUMENTS 4,878,201  10/1989  Nakaizumi ......................... 365/189.09
4,943,952  7/1990   Terayama ............................... 365/203
5,305,259  4/1994   Kim ....................................... 365/203

OTHER PUBLICATIONS

S. Aizaki, et al., "A 15-ns 4-Mb CMOS SRAM", EIII Journal of Solid-State Circuits, vol. 25, No. 5, Oct. 1990.

Primary Examiner—David C. Nelms
Assistant Examiner—Vu A. Le

[57] ABSTRACT

A compound semiconductor static random access memory device has a precharge driving circuit for producing a precharge driving signal n-channel enhancement type compound semiconductor field effect transistors responsive to the precharge driving signal for charging bit lines to a positive power voltage level, and the precharge driving circuit bootstraps the precharge driving signal over the positive power voltage level so as to rapidly complete the precharging operation without sacrifice of stability of the read-out and write-in operations.

11 Claims, 4 Drawing Sheets

COMPOUND SEMICONDUCTOR STATIC RANDOM ACCESS MEMORY DEVICE EQUIPPED WITH PRECHARGING CIRCUIT CONTROLLED BY BOOSTED SIGNAL

FIELD OF THE INVENTION

This invention relates to a compound semiconductor static random access memory device and, more particularly, to a compound semiconductor static random access memory device having a precharging circuit controlled by a boosted signal.

DESCRIPTION OF THE RELATED ART

Figure 1:
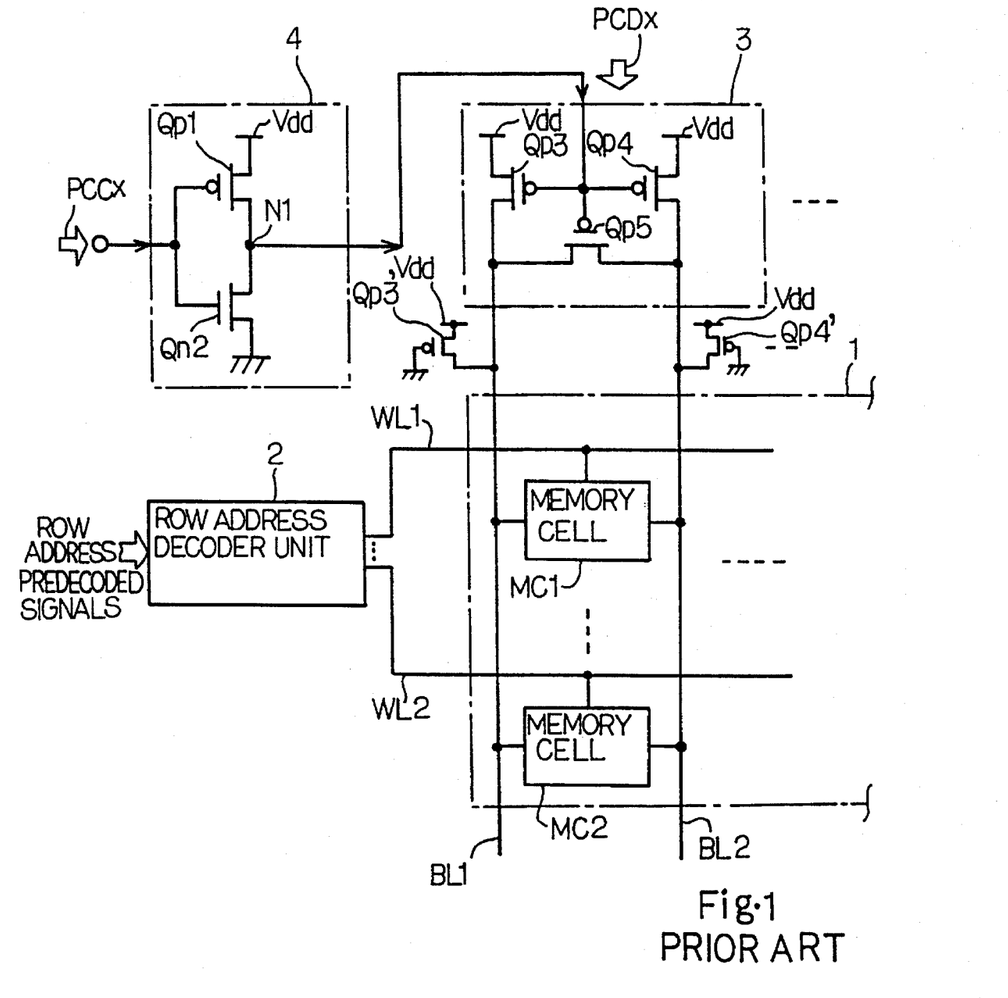
FIG. 1 is a circuit diagram showing the arrangement of the prior art static random access memory device.

A static random access memory device of the type implemented by silicon-channel type field effect transistors is widely used in various electronic systems as a high-speed data storage, and FIG. 1 illustrates a typical example of the static random access memory device.

The prior art static random access memory device comprises a memory cell arrays 1 or a plurality of flip-flop type memory cells MC1, . . . and MC2 arranged in rows and columns. However, only one column of flip-flop type memory cells MC1 to MC2 is shown in FIG. 1, and description is made on the column of flip-flop type memory cells MC1 to MC2 and associated peripheral circuit. Though not shown in the drawings, two complementary inverters and two n-channel enhancement type switching transistors form in combination the flip-flop type memory cell, and the two complementary inverters selectively couple two common drain nodes thereof to a positive power voltage line and a ground voltage line so as to maintain the flip-flop type memory cell in one of two stable states.

The column of flip-flop type memory cells MC1 to MC2 is associated with a pair of bit lines BL1/BL2, and the n-channel enhancement type switching transistors are coupled between the bit lines BL1/BL2 and the common drain nodes of the complementary inverters. As a result, when the n-channel enhancement type switching transistors turn on, the common drain nodes are electrically connected through the n-channel enhancement type switching transistors to the bit lines BL1 and BL2, respectively.

The prior art static random access memory device further comprises a plurality of word lines WL1 to WL2 selectively driven by a row address decoder unit 2, and the plurality of word lines WL1 to WL2 are respectively associated with the rows of flip-flop type memory cells MC1 to MC2. The word lines WL1 to WL2 are respectively connected to the gate electrodes of the n-channel enhancement type switching transistors, and one of the word lines WL1 to WL2 selected by the row address decoder unit 2 causes the n-channel enhancement type switching transistors of the associated row to turn on.

The prior art static random access memory device further comprises a precharge and balance circuit 3 and a precharge driver circuit 4. The precharge driver circuit 4 is responsive to a precharge control signal PCCx for generating a precharge drive signal PCDx, and the precharge and balance circuit 3 charges the associated bit lines BL1 and BL2 to the positive power voltage level Vdd.

In detail, the precharge driver circuit 4 is implemented by a complementary inverter or a series combination of a p-channel enhancement type switching transistor Qp1 and an n-channel enhancement type switching transistor Qn2 coupled between the positive power voltage line Vdd and the ground voltage line. The precharge control signal PCCx is supplied to the gate electrode of the p-channel enhancement type switching transistor Qp1 and the gate electrode of the n-channel enhancement type switching transistor Qn2, and causes the p-channel enhancement type switching transistor Qp1 and the n-channel enhancement type switching transistor Qn2 to complementariliy turn on and off. As a result, the common drain node N1 is electrically connected through the p-channel enhancement type switching transistor Qp1 to the positive power voltage line Vdd or through the n-channel enhancement type switching transistor Qn2 to the ground voltage line. Thus, the precharge driver circuit 4 changes the precharge drive signal PCDx between the positive power voltage Vdd and the ground voltage level in response to the precharge control signal PCCx.

The precharge and balance circuit 3 comprises three p-channel enhancement type switching transistors Qp3, Qp4 and Qp5, and the precharge drive signal PCDx is supplied to the gate electrodes of the p-channel enhancement type switching transistors Qp3 to Qp5. The p-channel enhancement type switching transistors Qp3 and Qp4 are coupled between the positive power voltage line Vdd and the bit lines BL1 and BL2, and the p-channel enhancement type switching transistor Qp5 is coupled between the bit lines BL1 and BL2.

The prior art static random access memory device further comprises p-channel enhancement type charging transistors Qp3' and Qp4' coupled between the positive power voltage level Vdd and the bit lines BL1 and BL2, and the gate electrodes of the p-channel enhancement type enhancement type charging transistors Qp3' and Qp4' are grounded. For this reason, the p-channel enhancement type charging transistors Qp3' and Qp4' are usually turned on, and electrically connect the bit lines BL1 and BL2 to the positive power voltage line Vdd.

While the precharge drive signal PCDx is staying at the positive power voltage level Vdd, all of the p-channel enhancement type switching transistors Qp3 to Qp5 are turned off, and the bit lines BL1 and BL2 are electrically isolated from the positive power voltage line Vdd.

On the other hand, when the precharge drive signal PCDx is changed to the ground voltage level, the p-channel enhancement type switching transistors Qp3 to Qp5 concurrently turn on, and electrically connect the positive power voltage line Vdd to the bit lines BL1 and BL2. The p-channel enhancement type switching transistor Qp5 also turns on, and balances the bit line BL1 with the bit line BL2.

After the precharge and balance stage, the precharge drive signal PCDx is recovered to the positive power voltage level Vdd, and the p-channel enhancement type switching transistors Qp3 to Qp5 turn off. Thereafter, the row address decoder unit 2 changes one of the word lines WL1 to WL2 to a selecting level, and one of the bit lines BL1 and BL2 is electrically connected through the flip-flop type memory cell to the ground voltage line. The current flows through the p-channel enhancement type charging transistor Qp3'/Qp4' and the flip-flop type memory cell to the ground voltage line, and the potential level on the bit line BL1/BL2 is decayed. On the other hand, the other bit line BL2/BL1 is electrically connected through the flip-flop type memory cell to the positive power voltage line Vdd and through the other p-channel enhancement type charging transistor Qp4'/Qp3' to the positive power voltage line Vdd, and the positive power voltage level is maintained on the other bit line BL2/BL1. Then, a potential difference is produced between the bit lines BL1 and BL2, and is transferred through a column selector (not shown) and a data bus (not shown) to an input and output circuit.

The prior art static random access memory device allows an external device to access stored data at fairly high speed. However, it is well known that the electron mobility in a compound semiconductor material such as gallium arsenide is larger than the electron mobility in silicon, and the compound semiconductor material is expected to improve the access speed to data information stored in the static random access memory device. The static random access memory device of the type implemented by the compound semiconductor is referred to as "compound semiconductor static random access memory device".

Figure 2:
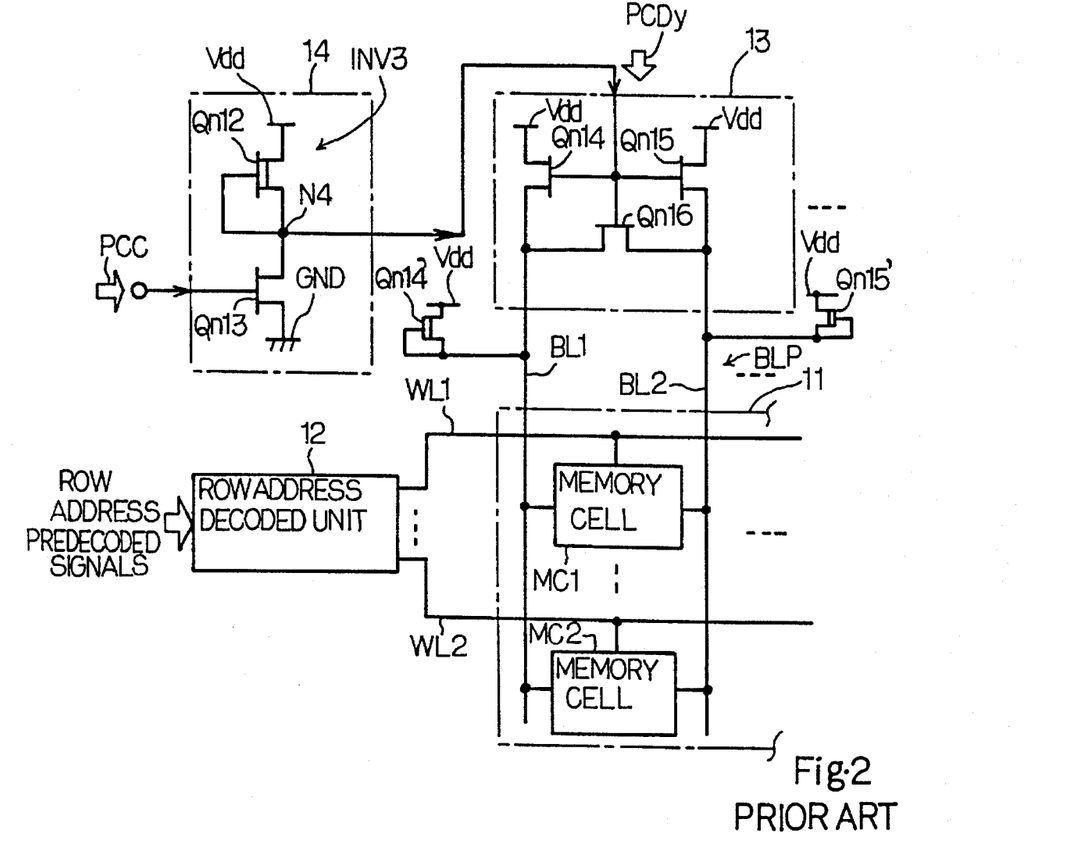
FIG. 2 is a circuit diagram showing the arrangement of the prior art compound semiconductor static random access memory device.

FIG. 2 illustrates a prior art compound semiconductor static random access memory device, and the prior art compound semiconductor static random access memory device is implemented by n-channel enhancement type gallium arsenide field effect transistors. This is because of the fact that the carrier mobility of p-channel gallium arsenide field effect transistor is rather small than the n-channel gallium arsenide filed effect transistor.

The prior art compound semiconductor static random access memory device comprises a memory cell arrays 11 or a plurality of flip-flop type memory cells MC1, . . . and MC2 arranged in rows and columns. However, only one column of flip-flop type memory cells MC1 to MC2 is shown in FIG. 2.

The columns of the memory cell array 11 are respectively associated with a plurality of bit line pairs BLP, and the rows of the memory cell array 11 are respectively associated with a plurality of word lines WL1 to WL2. Each of the bit line pairs BLP has two bit lines BL1 and BL2, and the word lines WL1 to WL2 are respectively provided for the flip-flop type memory cells MC1 to MC2.

Figure 3:
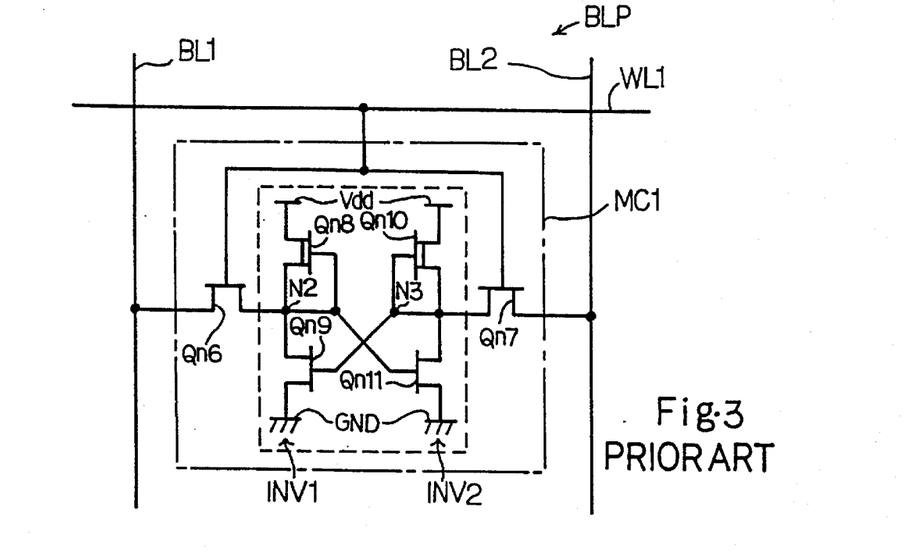
FIG. 3 is a circuit diagram showing the arrangement of the flip-flop type memory cell incorporated in the prior art compound semiconductor static random access memory device.

All of the flip-flop type memory cells MC1 to MC2 are similar in circuit arrangement to one another, and FIG. 3 illustrates the flip-flop type memory cell MC1.

Two DCFL (Direct Coupled FET Logic) type inverters INV1 and INV2 and two n-channel enhancement type gallium arsenide field effect transistors Qn6 and Qn7 form in combination the flip-flop type memory cell MC1, and a series combination of an n-channel depletion type gallium arsenide field effect transistor Qn8 and an n-channel enhancement type gallium arsenide field effect transistor Qn9 and another series combination of an n-channel depletion type gallium arsenide field effect transistor Qn10 and an n-channel enhancement type gallium arsenide field effect transistor Qn11 serve as the two DCFL-type inverters INV1 and INV2. The two DCFL type inverters INV1 and INV2 are coupled in parallel between the positive power voltage line Vdd and the ground voltage line GND, and common drain nodes N2 and N3 of the series combinations are coupled to the gate electrodes of the gallium arsenide field effect transistors Qn8 and Qn11 and the gate electrodes of the gallium arsenide filed effect transistors Qn9 and Qn10. Therefore, when a potential difference is transferred to the common drain nodes N2 and N3, the two DCFL type inverters INV1 and INV2 are complementary switched, and maintain the potential difference between the common drain nodes N2 and N3. The n-channel depletion type gallium arsenide field effect transistors Qn8 and Qn10 are smaller in current driving capability than the n-channel enhancement type gallium arsenide field effect transistors Qn9 and Qn11, and the discharging operation on the bit line through the n-channel enhancement type gallium arsenide field effect transistor Qn9 or Qn11 is faster than the charging operation on the bit line through the n-channel depletion type gallium arsenide field effect transistor Qn8 or Qn10.

The word line WL1 is connected to the gate electrodes of the n-channel enhancement type gallium arsenide field effect transistors Qn6 and Qn7, and the source-and-drain paths of the n-channel enhancement type gallium arsenide field effect transistors Qn6 and Qn7 are coupled between the bit line BL1 and the common drain node N2 and between the other bit line BL2 and the common drain node N3, respectively.

The word lines WL1 to WL2 are connected to a row address decoder unit 12 (see FIG. 1), and the row address decoder unit 12 changes one of the word lines WL1 to WL2 to an active level in response to row address predecoded signals.

If the row address decoder unit 12 changes the word line WL1 to the active level, the n-channel enhancement type gallium arsenide field effect transistors Qn6 and Qn7 of the memory cell MC1 concurrently turn on, and the bit lines BL1 and BL2 are electrically connected through the n-channel enhancement type gallium arsenide field effect transistors Qn6 and Qn7 to the common drain nodes N2 and N3.

The prior art compound semiconductor static random access memory device further comprises a precharge and balance circuit 13 and a precharge driver circuit 14. The precharge driver circuit 14 is responsive to a precharge control signal PCC for generating a precharge drive signal PCDy, and the precharge and balance circuit 13 charges the associated bit lines BL1 and BL2 to a positive voltage level Vpc lower than the positive power voltage level Vdd by the threshold Vth of the n-channel enhancement type gallium arsenide field effect transistor.

In detail, the precharge driver circuit 14 is implemented by a DCFL type inverter INV3 or a series combination of an n-channel depletion type gallium arsenide field effect transistor Qn12 and an n-channel enhancement type gallium arsenide field effect transistor Qn13 coupled between the positive power voltage line Vdd and the ground voltage line GND. The precharge control signal PCC is supplied to the gate electrode of the n-channel depletion type gallium arsenide field effect transistor Qn12 and the gate electrode of the n-channel enhancement type gallium arsenide field effect transistor Qn13, and causes the n-channel depletion type gallium arsenide field effect transistor Qn12 and the n-channel enhancement type gallium arsenide field effect transistor Qn13 to complementariliy turn on and off. As a result, the common drain node N4 of the DCFL type inverter INV3 is electrically connected through the n-channel depletion type gallium arsenide field effect transistor Q12 to the positive power voltage line Vdd or through the n-channel enhancement type gallium arsenide field effect transistor Qn13 to the ground voltage line GND. Thus, the precharge driver circuit 14 changes the precharge drive signal PCDy between the positive power voltage level Vdd and the ground voltage level.

The precharge and balance circuit 13 comprises three n-channel enhancement type gallium arsenide field effect transistors Qn14, Qn15 and Qn16, and the precharge drive signal PCDy is supplied to the gate electrodes of the n-channel enhancement type gallium arsenide field effect transistors Qn14 to Qn16. The n-channel enhancement type gallium arsenide field effect transistors Qn14 and Qn15 are coupled between the positive power voltage line Vdd and the bit lines BL1 and BL2, and the n-channel enhancement type gallium arsenide field effect transistor Qn16 is coupled between the bit lines BL1 and BL2.

The n-channel enhancement type gallium arsenide field effect transistors Qn14 and Qn15 have the threshold Vth, and, for this reason, a potential drop equal to the threshold Vth takes place at the drain nodes thereof with respect to the gate electrodes.

The prior art compound semiconductor static random access memory device further comprises n-channel depletion type gallium arsenide field effect transistors Qn14' and Qn15' are coupled between the positive power voltage level Vdd and the bit lines BL1 and BL2, and the gate electrodes of the n-channel depletion type gallium arsenide field effect transistors Qn14' and Qn15' are coupled to the drain nodes or the bit lines BL1 and BL2.

While the precharge drive signal PCDy is staying at the ground voltage level GND all of the n-channel enhancement type gallium arsenide field effect transistors Qn14 to Qn16 are turned off, and the bit lines BL1 and BL2 are electrically isolated from the positive power voltage line Vdd.

When a data access is requested, the precharge drive signal PCDy is changed to the positive power voltage level Vdd, and the n-channel enhancement type gallium arsenide field effect transistors Qn14 and Qn15 concurrently turn on so as to electrically connect the positive power voltage line Vdd to the bit lines BL1 and BL2. Then, the bit lines BL1 and BL2 are charged to the positive voltage level Vpc. The n-channel enhancement type gallium arsenide field effect transistor Qp16 also turns on, and balances the bit line BL1 with the bit line BL2.

After the precharge and balance stage, the precharge drive signal PCDy is changed to the ground voltage level, and the n-channel enhancement type gallium arsenide field effect transistors Qn14 to Qn16 turn off. Thereafter, the row address decoder unit 12 changes one of the word lines WL1 to WL2 to the active level, and one of the bit lines BL1 and BL2 is electrically connected through the flip-flop type memory cell to the positive power voltage line Vdd and the ground voltage line GND. Namely, one of the bit lines BL1 and BL2 is electrically connected through the n-channel enhancement type gallium arsenide field effect transistors Qn6/Qn7 and Qn9/Qn11 to the ground voltage line GND, and the n-channel depletion type gallium arsenide field effect transistor Qn14'/Qn15' makes up current to the bit line BL1/B12. On the Other hand, the n-channel depletion type gallium arsenide field effect transistor Qn8/Qn10 supplies current through the n-channel enhancement type gallium arsenide field effect transistor Qn7/Qn6 to the other bit line BL2/BL1, and the other bit line BL2/BL1 goes up toward the positive power voltage level Vdd. Then, a potential difference is produced between the bit lines BL1 and BL2, and is transferred through a column selector (not shown) and a data bus (not shown) to an input and output circuit.

Thus, the compound semiconductor static random access memory device behaves as similar to the standard static random access memory device shown in FIG. 1.

However, a problem is encountered in the compound semiconductor static random access memory device in that the access speed in not enhanced as being expected.

SUMMARY OF THE INVENTION

It is therefore an important object of the present invention to provide a compound semiconductor static random access memory device which is improved in access speed.

The present inventor contemplated the problem, and noticed that large channel-resistance of the n-channel depletion type gallium arsenide field effect transistors Qn8 and Qn10 decelerated the development of a potential difference between the bit lines BL1 and BL2.

In detail, the n-channel enhancement type gallium arsenide field effect transistors Qn14 and Qn15 did not charge the bit lines BL1 and BL2 to the positive power voltage level Vdd, and the precharging level Vpc was lower than the positive power voltage level Vdd. This meant that the development of the potential difference started from the precharging level Vpc toward the positive power voltage level Vdd and a certain level determined by the on-resistance of the n-channel depletion type gallium arsenide field effect transistor Qn14'/Qn15' and the on-resistances of the n-channel enhancement type gallium arsenide field effect transistors Qn6/Qn7 and Qn9/Qn11.

As described hereinbefore, the n-channel depletion type gallium arsenide field effect transistors Qn8 and Qn10 were small in current driving capability, and consumed long time until the associated bit line BL1/BL2 reached the positive power voltage level. The pull-up operation was indispensable, because an insufficient potential difference is causative of an error data bit.

The large potential different free from the error data bit further requested the wide pull-down operation on the other bit line. The amount of current passing through the other bit line was assumed to be constant, and the potential level on the other bit line was determined by the on-resistance of the n-channel depletion type gallium arsenide filed effect transistor Qn14'/Qn15' and the on-resistances of the n-channel enhancement type gallium arsenide field effect transistors Qn6/Qn7 and Qn9/Qn11. If the on-resistance of the n-channel depletion type gallium arsenide field effect transistor Qn14'/Qn15' was relatively small, the potential level on the other bit line was rapidly dropped; however, potential difference between the bit lines BL1 and BL2 was small.

On the other hand, if the on-resistance of the n-channel depletion type gallium arsenide field effect transistor Qn14'/Qn15' was relatively large, the potential level on the other bit line was widely dropped, and a large potential difference took place between the bit lines BL1 and BL2. However, the potential difference was slowly developed due to a large time constant, i.e., the product between the large on-resistance and the parasitic capacitance of the other bit line.

In order to produce a large potential difference, a manufacturer usually designed the on-resistance of the n-channel depletion type gallium arsenide field effect transistor Qn14'/Qn15 ' to be relatively large. As a result, not only the pull-up operation but also the pull-down operation prolonged the development of the potential difference, and this resulted in the low access speed. The pull-up operation was rather time-consuming than the pull-down operation.

To accomplish the object, the present invention proposes to boost a precharge drive signal over a positive power voltage level for increasing a precharging level.

In accordance with the present invention, there is provided a compound semiconductor static random access memory device, comprising: a plurality of addressable memory cells respectively having pairs of memory nodes for storing data bits in the form of potential difference; a plurality of bit line pairs selectively associated with the plurality of addressable memory cells for propagating potential differences from or to memory cells selected from the plurality of addressable memory cells; an addressing means responsive to an address signal for selectively coupling the pairs of memory nodes of the memory cells to the plurality of bit line pairs; a precharging means coupled to the plurality of bit line pairs for precharging the plurality of bit lines to a precharging level, and including at least n-channel enhancement type charging transistors having respective gate electrodes and respective conductive channels of a compound semiconductor material and coupled between a source of power voltage level and bit lines of the plurality of bit line pairs; and a precharge driver unit responsive to a precharge control signal for supplying a precharge drive signal to the gate electrodes of the at least n-channel enhancement type charging transistors, and having a boosting circuit for boosting the precharge drive signal.

BRIEF DESCRIPTION OF THE DRAWINGS

The features and advantages of the compound semiconductor static random access memory device according to the present invention will be more clearly understood from the following description taken in conjunction with the accompanying drawings in which.

DESCRIPTION OF THE PREFERRED EMBODIMENT

Figure 4:
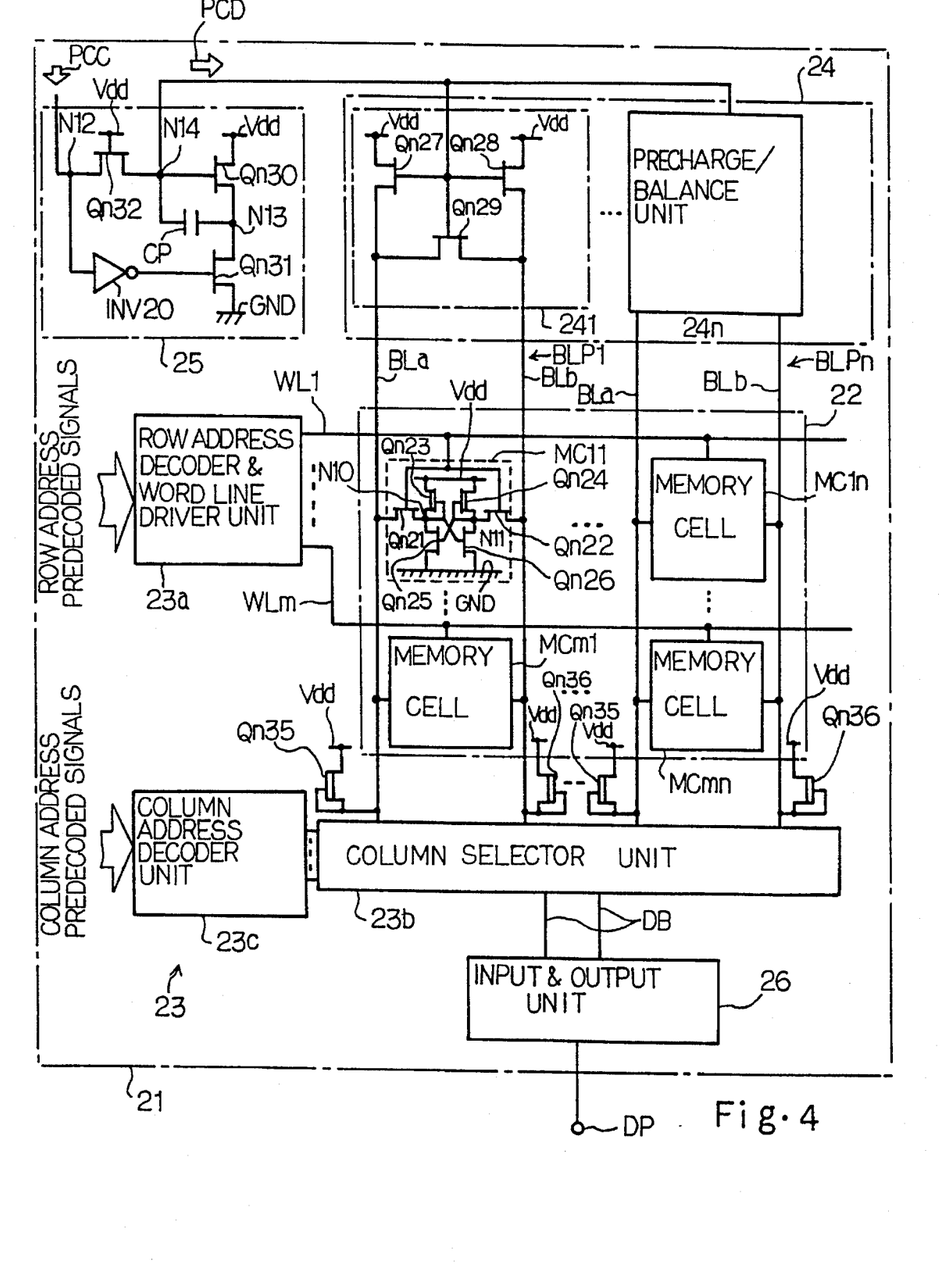
FIG. 4 is a circuit diagram showing the arrangement of a compound semiconductor static random access memory device according to the present invention.

Referring to FIG. 4 of the drawings, a compound semiconductor static random access memory device embodying the present invention is fabricated on a gallium arsenide substrate 21.

The compound semiconductor static random access memory device comprises a memory cell array 22 having a plurality of static memory cells MC11 , . . . , MC1n, . . . . , MCm1, ... and MCmn arranged in rows and columns. All of the static memory cells MC11 to MCmn are similar in circuit arrangement to one another, and each of the static memory cells MC11 to MCmn includes two n-channel enhancement type gallium arsenide field effect transistors Qn21/Qn22 and two DCFL inverters, i.e., two series combinations of n-channel depletion type gallium arsenide field effect transistors Qn23/Qn24 and n-channel enhancement type gallium arsenide filed effect transistors Qn25/Qn26 coupled between a source of positive power voltage level Vdd and a ground voltage line GND. The common drain nodes of the two series combinations are labeled with N10 and N11, respectively.

The compound semiconductor static random access memory device further comprises a plurality of word lines WL1 to WLm respectively associated with the rows of static memory cells MC11 to MC1n, ... and MCm1 to MCmn, and each of the word lines WL1 to WLm is connected to the gate electrodes of the n-channel enhancement type gallium arsenide field effect transistors Qn21 and Qn22 of the associated row of static memory cells MC11 to MC1n, . . . or MCm1 to MCmn.

The compound semiconductor static random access memory device further comprises a plurality of bit line pairs BLP1 to BLPn, and bit lines BLa and BLb form in combination each of the bit line pairs BLP1 to BLPn. The bit lines BLa and BLb are connected to source/drain nodes of the n-channel enhancement type gallium arsenide field effect transistors Qn21 and Qn22 of the associated column of static memory cells MC11 to MCm1, . . . . or MC1n to MCmn, and are electrically connectable to the common drain nodes N10/N11 of the associated static memory cells MC11 to MCm1, . . . or MC1n to MCmn.

The compound semiconductor static random access memory device further comprises an addressing system 23, and the addressing system includes a row address decoder and word line driver unit 23a coupled to the word lines WL1 to WLm, a column selector unit 23b coupled between the plurality of bit line pairs BLP1 to BLPn and a data bus and a column address decoder unit 23c coupled through column address decoded signal lines to the column selector unit 23b.

The row address decoder and word line driver unit 23a is responsive to row address predecoded signals produced from an external row address signal so as to change one of the word lines WL1 to WLm to an active level. Then, the word line WL1/WLm of the active level causes the n-channel enhancement type gallium arsenide field effect transistors Qn21 and Qn22 coupled thereto to turn on, and the bit line pairs BLP1 to BLPn are electrically connected to the common drain nodes N10 and N11 of the associated static memory cells.

The column address decoder unit 23c is responsive to column address predecoded signals produced form an external column address signal so as to change one of the column address decoded signal lines to an active level. The column address decoded signal lines of the active level causes the column selector unit 23b to couple one of the bit line pairs BLP1 to BLPn to the data bus DB, and a potential difference is transferred between the selected bit line pair and the data bus DB.

The compound semiconductor static random access memory device further comprises a precharge and balance unit 24, and the precharge and balance unit 24 includes a plurality of precharge and balance circuits 241 to 24n. The precharge and balance circuits 241 to 24n are similar in circuit arrangement to one another, and are respectively associated with the bit line pairs BLP1 to BLPn. Each of the precharge and balance circuits 241 to 24n has two n-channel enhancement type gallium arsenide field effect transistors Qn27 and Qn28 coupled between the positive power voltage line Vdd and the bit lines BLa and BLb and an n-channel enhancement type gallium arsenide field effect transistor Qn29 coupled between the bit lines BLa and BLb. A precharge driving signal PCD is supplied to the gate electrodes of the n-channel enhancement type gallium arsenide field effect transistors Qn27, Qn28 and Qn29.

The compound semiconductor static random access memory device further comprises a precharge driver circuit 25 responsive to a precharge control signal PCC for producing the precharge driving signal PCD. The precharge driver circuit 25 boosts the precharge driving signal PCD over the positive power voltage level Vdd, and allows the precharge driver unit 24 to charge the bit line pairs BLP1 to BLPn to the positive power voltage level Vdd.

The precharge driver circuit 25 comprises a series combination of n-channel enhancement type gallium arsenide field effect transistors Qn30 and Qn31 coupled between the positive power voltage line Vdd and the ground voltage line GND, an n-channel enhancement type gallium arsenide field effect transistor Qn32 coupled between an input node N12 of the precharge driver circuit 25 and the gate electrode of the n-channel enhancement type gallium arsenide field effect transistor Qn30, an inverter INV20 coupled between the input node N12 and the gate electrode of the n-channel enhancement type gallium arsenide field effect transistor Qn31 and a bootstrap capacitor CP coupled between the gate electrode of the n-channel enhancement type gallium arsenide field effect transistor Qn30 and a common drain node N13. The gate electrode of the n-channel enhancement type gallium arsenide field effect transistor Qn32 is coupled to the positive power voltage line Vdd.

A precharge control signal PCC is supplied from a timing controller (not shown) to the input node N12, and the precharge control signal 25 produces the precharge driving signal PCD at an output node N14 as described hereinlater in detail.

The bootstrap capacitor CP may be formed by using a depletion layer of a field effect transistor. In order to produce a capacitance of 0.1 pF by using a metal-SiON-metal structure, the metal-SiON-metal structure occupies 44 square micron under the thickness of SiON to be 1.0 micron. However, if the capacitance of 0.1 pF is realized by using the gate-and-source/drain capacitance of the field effect transistor, the field effect transistor occupies 5.5 square microns, and the occupation area is decreased to a sixty-sixth. Thus, the capacitor realized by the field effect transistor is desirable for an integrated circuit device.

In this instance, the n-channel enhancement type gallium arsenide field effect transistor Qn32, the bootstrap capacitor CP and an inverter INV20 form in combination a boosting circuit.

The compound semiconductor static random access memory device further comprises n-channel depletion type gallium arsenide field effect transistors Qn35 and Qn36 connected between the positive power voltage line Vdd and the bit lines BLa/ BLb, and the gate electrodes are connected to the associated bit lines BLa and BLb.

The compound semiconductor static random access memory device further comprises an input and output unit 26 coupled between the data bus DB and a data port DP. The input and output unit 26 generates an output data signal from the potential difference on the data bus DB in a read-out function and a potential difference from an input data signal at the data port DP in a write-in function.

Figure 5:
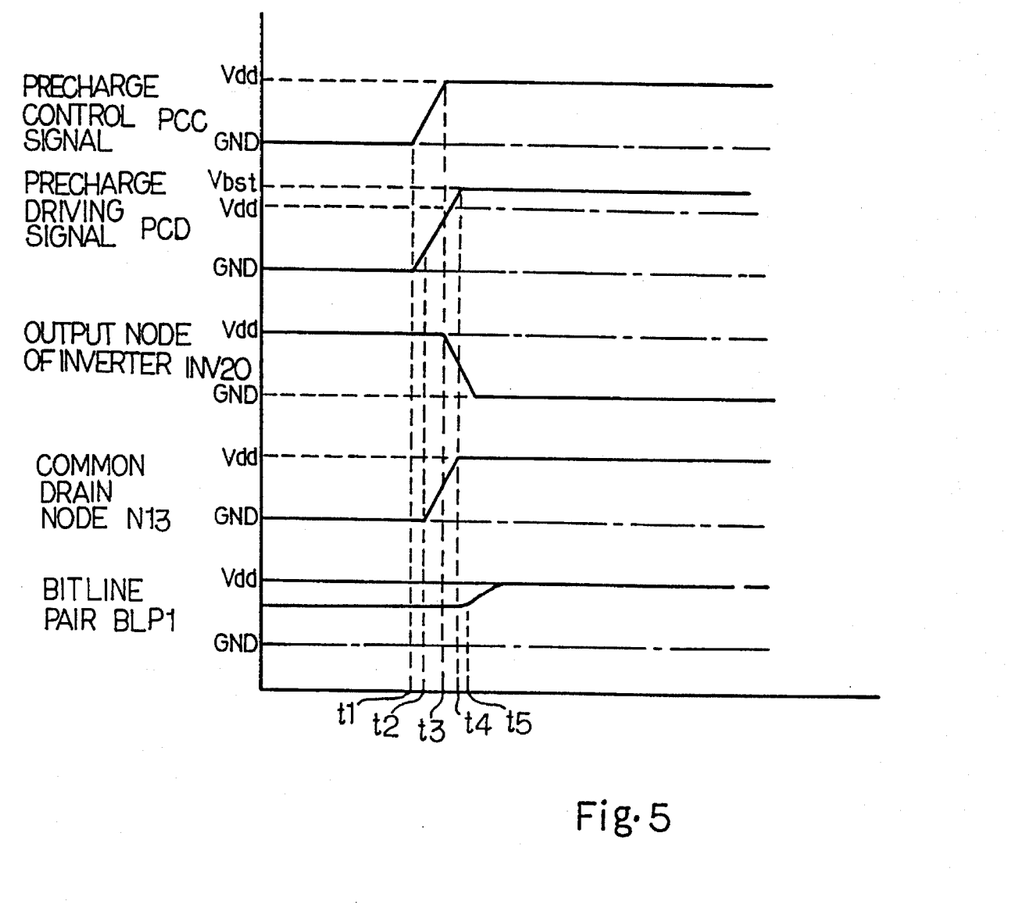
FIG. 5 is a diagram showing the waveforms of essential signals of the compound semiconductor static random access memory device.

FIG. 5 illustrates a precharging stage in the read-out/write-in function, and the compound semiconductor static random access memory device behaves as follows.

Before the read-out/write-in function, the precharge control signal PCC is in the ground voltage level, and the inverter INV20 supplies the positive power voltage level Vdd to the gate electrode of the n-channel enhancement type gallium arsenide field effect transistor Qn31. The n-channel enhancement type gallium arsenide field effect transistor Qn30 turns off, and the n-channel enhancement type gallium arsenide field effect transistor Qn31 turns on. As a result, the common drain node N13 and the precharge driving signal PCD are in the ground voltage level.

The precharge control signal PCC starts to change the voltage level from the ground voltage level GND to the positive power voltage level Vdd at time t1, and the precharge driving signal PCD follows the precharge control signal PCC. The inverter INV20 introduces delay, and the output node of the inverter INV20 is still in the positive power voltage level Vdd.

If the precharge driving signal PCD exceeds the threshold of the n-channel enhancement type gallium arsenide field effect transistor Qn30 at time t2, both of the n-channel enhancement type gallium arsenide field effect transistors Qn30 and Qn31 turn on, and current flows from the positive power voltage line Vdd through the n-channel enhancement type gallium arsenide field effect transistors Qn30 and Qn31 to the ground voltage line GND. The potential level at the common drain node N13 starts to rise at time t2, and reaches a certain level Vphi between the ground voltage level and the threshold Vth of the n-channel enhancement type gallium arsenide filed effect transistor Qn31 at time t3. The potential level applied to the bootstrap capacitor CP is (Vdd–Vphi).

The inverter INV20 starts to change the potential level at the output node thereof from the positive power voltage level Vdd to the ground voltage level at time t3, and the n-channel enhancement type gallium arsenide field effect transistor Qn31 turns off. As a result, the precharge driving signal PCD is boosted over the positive power voltage level Vdd by (Vdd–Vphi), and reaches a boosted level Vbst.

The precharge driving signal PCD causes the n-channel enhancement type gallium arsenide field effect transistors Qn27, Qn28 and Qn29 to turn on, and the positive power voltage line Vdd is coupled through the n-channel enhancement type gallium arsenide field effect transistors Qn27 and Qn28 to the bit lines BL1 and BL2. The precharge driving signal PCD is higher than the positive power voltage level Vdd by (Vdd–Vth), and the bit lines BL1 and BL2 reach the positive power voltage level Vdd at time t5.

The boosted precharge driving signal PCD enhances the channel conductance of the n-channel enhancement type gallium arsenide field effect transistors Qn14 and Qn15, and the bit lines BLa and BLb are rapidly changed to the positive power voltage level Vdd.

If (Vdd–Vphi) is larger in the concurrent on-state of the n-channel enhancement type gallium arsenide field effect transistors Qn30 and Qn31, the electric charge boosting the precharge driving signal PCD is increased.

The above described precharging stage is simply summarized in the following table.

TABLE

| Lapse of time | PCC | PCD | Output of INV20 | N13 | Qn30 | Qn31 |
|---|---|---|---|---|---|---|
| zero | GND | GND | Vdd | GND | off | on |
| short | Vdd | Vdd | Vdd | Vphi | on | on |
| long | Vdd | Vdd | GND | Vdd | on | off |

Though not shown in FIG. 5, the precharge control signal PCC is recovered to the ground voltage level, and, accordingly, the precharge drive signal PCD is also decayed to the ground voltage level. As a result, the n-channel enhancement type gallium arsenide field effect transistors Qn27 to Qn29 turn off, and the bit lines BLa/BLb are electrically isolated from the positive power voltage line Vdd.

Thereafter, the row address decoder and word line driver unit 23a changes the word line WL1 to the active level, by way of example, and the pairs of common drain nodes N10/N11 of the memory cells MC11 to MC1n are electrically connected to the bit line pairs BLP1 to BLPn.

One of the bit lines BLa/BLb is coupled through the n-channel depletion type field effect transistor Qn23/Qn24 and the n-channel enhancement type field effect transistor Qn21/Qn22 to the positive power voltage line Vdd. However, the n-channel depletion type gallium arsenide field effect transistor Qn23/Qn24 is not expected to carry out a pull-up operation, because the bit line BLa/BLb has been already charged to the positive power voltage level.

The other bit line BLb/BLa is connected through the n-channel depletion type gallium arsenide field effect transistor Qn36/Qn35 to the positive power voltage line Vdd and through the n-channel enhancement type field effect transistors Qn22/Qn21 and Qn26/Qn25 to the ground voltage line GND. Then, the other bit line BLb/BLa is decayed, and the potential level reaches a value determined by the on-resistance of the n-channel depletion type gallium arsenide field effect transistor Qn36/Qn35 and the on-resistances of the n-channel enhancement type gallium arsenide field effect transistors Qn22/Qn21 and Qn26/Qn25. Although the n-channel enhancement type gallium arsenide field effect transistor Qn25/Qn26 is expected to widely pull down the potential level on the bit line BLa/BLb, the n-channel enhancement type gallium arsenide field effect transistor Qn25/Qn26 is large in current driving capability, and the potential difference is rapidly produced between the bit lines BLa and BLb, because the pull-up operation is omitted.

Thus, potential differences rapidly take place between the bit lines BLa and BLb of the respective bit line pairs BLP1 to BLPn. The potential differences are large enough to prevent the data bits read out from the memory cells MC11 to MCmn from undesirable inversion.

The column address decoder unit 23c causes the column selector unit 23b to, by way of example, couple the bit line pair BLP1 to the data bus DB. If the read-out function is requested, the potential difference on the bit line pair BLP1 is transferred through the column selector unit 23b to the data bus DB, and the input and output unit 26 supplies the output data signal to the data port DP. On the other hand, if the write-in function is requested, the input and output unit 26 generates the potential difference indicative of the input data bit, and the potential difference on the data bus DB is transferred through the column selector unit 23b and the bit line pair BLP1 to the memory cell MC11.

Finally, the word line WL1 is recovered to the ground voltage level, and the bit line pairs BLP1 to BLPn are isolated from the memory cells MC11 to MCmn.

As will be appreciated from the foregoing description, the compound semiconductor static random access memory device according to the present invention boosts the pre-charge driving signal PCD over the positive power voltage level Vdd, and the precharge and balance circuits 241 to 24n rapidly charges the bit line pairs BLP1 to BLPn through the n-channel enhancement type gallium arsenide field effect transistors Qn27 and Qn28 to the positive power voltage level Vdd. This results in that an improved access speed without sacrifice of the stability.

Although a particular embodiment of the present invention has been shown and described, it will be obvious to those skilled in the art that various changes and modifications may be made without departing from the spirit and scope of the present invention.

For example, another compound semiconductor such as, for example, indium-phosphide system may be used for the field effect transistors, and sense amplifiers may be connected to the bit line pairs BLP1 to BLPn.

Moreover, the compound semiconductor static random access memory device may form a part of a large scale integration.

What is claimed is:

1. A compound semiconductor static random access memory device, comprising:

a plurality of addressable memory cells respectively having pairs of memory nodes for storing data bits in the form of potential difference;

a plurality of bit line pairs selectively associated with said plurality of addressable memory cells for propagating potential differences from or to memory cells selected from said plurality of addressable memory cells;

an addressing means responsive to an address signal for selectively coupling the pairs of memory nodes of said memory cells to said plurality of bit line pairs;

a precharging means coupled to said plurality of bit line pairs for precharging said plurality of bit lines to a precharging level, and including at least n-channel enhancement type charging transistors having respective gate electrodes and respective n-type conductive channels of a compound semiconductor material and coupled between a source of power voltage level and bit lines of said plurality of bit line pairs, said compound semiconductor having an electron mobility larger than a hole mobility; and a precharge driver unit responsive to a precharge control signal for supplying a precharge drive signal to said gate electrodes of said at least n-channel enhancement type charging transistors, and having a boosting circuit for boosting said precharge drive signal.

2. The compound semiconductor static random access memory device as set forth in claim 1, in which said precharge driver unit comprises a series combination of a first n-channel enhancement type compound semiconductor field effect transistor and a second n-channel enhancement type compound semiconductor field effect transistor having a current path coupled between a source of first power voltage level and a source of second power voltage level, a third n-channel enhancement type compound semiconductor field effect transistor having a gate electrode coupled to said source of first power voltage level and a source-and-drain path coupled between an input node for said precharge control signal and a gate electrode of said first n-channel enhancement type compound semiconductor field effect transistor, an inverter having an input node coupled to said input node for said precharge control signal and an output node coupled to a gate electrode of said second n-channel enhancement type compound semiconductor field effect transistor, and a bootstrap capacitor coupled between said gate electrode of said first n-channel enhancement type compound semiconductor field effect transistor and a drain node of said first n-channel enhancement type compound semiconductor field effect transistor.

3. The compound semiconductor static random access memory device as set forth in claim 2, in which said bootstrap capacitor is formed by using a capacitance between a gate electrode and source and drain nodes of a field effect transistor.

4. The compound semiconductor device as set forth in claim 1, in which said precharging means further includes n-channel enhancement type balancing transistors having respective gate electrodes supplied with said precharge driving signal, each of said n-channel enhancement type balancing transistors having a conductive channel of said compound semiconductor material coupled between bit lines of one of said plurality of bit line pairs.

5. The compound semiconductor static random access memory device as set forth in claim 1, further comprising a plurality of pairs of depletion type field effect transistors respectively associated with said plurality of bit line pairs, depletion type field effect transistors of each of said plurality of pairs of depletion type field effect transistors having conductive channels of said compound semiconductor material between said source of power voltage and the respective bit lines of one of said plurality of bit line pairs and a gate electrode connected to one of said respective bit lines.

6. A semiconductor memory device comprising:

a first bit line and a second bit line paired with one another;

a plurality of word lines;

a plurality of flip-flop type memory cells respectively associated with said plurality of word lines, and each having a first memory node and a second memory node electrically connected to said first bit line and said second bit line when one of said word lines is changed to an active level;

a precharge and equalize circuit including a first compound semiconductor transistor having a drain supplied with a power voltage level, a source coupled to said first bit line and a gate electrode supplied with a precharge driving signal, a second compound semiconductor transistor having a drain supplied with said power voltage level, a source coupled to said second bit line and a gate electrode supplied with said precharge driving signal and a third compound semiconductor transistor having a source and a drain coupled between said first bit line and said second bit line and a gate electrode supplied with said precharge driving signal; and a precharge driving circuit for producing said precharge driving signal boosted to an active level higher than said power voltage level at a predetermined timing.

7. The semiconductor memory device as set forth in claim 6, in which said precharge driving circuit is of a bootstrapping circuit type including a first enhancement type transistor having a drain supplied with a precharge control signal and a gate electrode supplied with said power voltage level, a logic-inverting time-delay circuit having an input node supplied with said precharge control signal and an output node so as to introduce a time delay between said precharge control signal at said input node and an inverted precharge control signal at said output node, a second enhancement type transistor having a drain supplied with said power voltage level and a gate electrode coupled to a source of said first enhancement type transistor, a third enhancement type transistor having a drain coupled to a source of said second enhancement type transistor, a gate coupled to said output node of said logic-inverting time-delay circuit and a source coupled to a reference voltage source, and a capacitor element coupled between said gate electrode and said source of said second enhancement type transistor, thereby producing said precharge driving signal having said active level higher than said power voltage level.

8. A compound semiconductor static random access memory device, comprising:

a plurality of addressable memory cells respectively having pairs of memory nodes for storing data bits in the form of potential difference;

a plurality of bit line pairs selectively associated with said plurality of addressable memory cells for propagating potential differences from or to memory cells selected from said plurality of addressable memory cells;

an addressing means responsive to an address signal for selectively coupling the pairs of memory nodes of said memory cells to said plurality of bit line pairs;

a precharging means coupled to said plurality of bit line pairs for precharging said plurality of bit lines to a precharging level, and including at least n-channel enhancement type charging transistors having respective gate electrodes and respective conductive channels of a compound semiconductor material and coupled between a source of power voltage level and bit lines of said plurality of bit line pairs; and a precharge driver unit responsive to a precharge control signal for supplying a precharge drive signal to said gate electrodes of said at least n-channel enhancement type charging transistors;

said precharge driver unit including;

a series combination of a first n-channel enhancement type compound semiconductor field effect transistor and a second n-channel enhancement type compound semiconductor field effect transistor having a current path coupled between a source of first power voltage level and a source of second power voltage level, a third n-channel enhancement type compound semiconductor field effect transistor having a gate electrode coupled to said source of first power voltage level and a source-and-drain path coupled between an input node for said precharge control signal and a gate electrode of said first n-channel enhancement type compound semiconductor field effect transistor, an inverter having an input node coupled to said input node for said precharge control signal and an output node coupled to a gate electrode of said second n-channel enhancement type compound semiconductor field effect transistor, and a bootstrap capacitor coupled between said gate electrode of said first n-channel enhancement type compound semiconductor field effect transistor and a drain node of said first n-channel enhancement type compound semiconductor field effect transistor for boosting said precharge drive signal.

9. A semiconductor memory device comprising:

a first bit line and a second bit line paired with one another;

a plurality of word lines;

a plurality of flip-flop type memory cells respectively associated with said plurality of word lines, and each having a first memory node and a second memory node electrically connected to said first bit line and said second bit line when one of said word lines is changed to an active level;

a precharge and equalize circuit including a first transistor having a drain supplied with a power voltage level, a source coupled to said first bit line and a gate electrode supplied with a precharge driving signal, a second transistor having a drain supplied with said power voltage level, a source coupled to said second bit line and a gate electrode supplied with said precharge driving signal and a third transistor having a source and a drain coupled between said first bit line and said second bit line and a gate electrode supplied with said precharge driving signal; and a precharge driving circuit for producing said precharge driving signal boosted to an active level higher than said power voltage level at a predetermined timing, and implemented by a bootstrapping circuit type including:

a first enhancement type transistor having a drain supplied with a precharge control signal and a gate electrode supplied with said power voltage level, a logic-inverting time-delay circuit having an input node supplied with said precharge control signal and an output node so as to introduce a time delay between said precharge control signal at said input node and an inverted precharge control signal at said output node, a second enhancement type transistor having a drain supplied with said power voltage level and a gate electrode coupled to a source of said first enhancement type transistor, a third enhancement type transistor having a drain coupled to a source of said second enhancement type transistor, a gate coupled to said output node of said logic-inverting time-delay circuit and a source coupled to a reference voltage source, and a capacitor element coupled between said gate electrode and said source of said second enhancement type transistor, thereby producing said precharge driving signal having said active level higher than said power voltage level.

10. A compound semiconductor static random access memory device, comprising:

a plurality of addressable memory cells respectively having pairs of memory nodes for storing data bits in the form of potential difference;

a plurality of bit line pairs selectively associated with said plurality of addressable memory cells for propagating potential differences from or to memory cells selected from said plurality of addressable memory cells;

an addressing system responsive to an address signal for selectively coupling the pairs of memory nodes of said memory cells to said plurality of bit line pairs;

a precharging unit coupled to said plurality of bit line pairs for precharging said plurality of bit lines to a precharging level, and including at least n-channel enhancement type charging transistors having respective gate electrodes and respective n-type conductive channels of a compound semiconductor material and coupled between a source of power voltage level and bit lines of said plurality of bit line pairs, said compound semiconductor having an electron mobility larger than a hole mobility; and a precharge driver unit responsive to a precharge control signal for supplying a precharge drive signal to said gate electrodes of said at least n-channel enhancement type charging transistors, and having a boosting circuit for boosting said precharge drive signal.

11. A compound semiconductor static random access memory device, comprising:

a plurality of addressable memory cells respectively having pairs of memory nodes for storing data bits in the form of potential difference;

a plurality of bit line pairs selectively associated with said plurality of addressable memory cells for propagating potential differences from or to memory cells selected from said plurality of addressable memory cells;

an addressing system responsive to an address signal for selectively coupling the pairs of memory nodes of said memory cells to said plurality of bit line pairs;

a precharging unit coupled to said plurality of bit line pairs for precharging said plurality of bit lines to a precharging level, and including at least n-channel enhancement type charging transistors having respective gate electrodes and respective conductive channels of a compound semiconductor material and coupled between a source of power voltage level and bit lines of said plurality of bit line pairs; and a precharge driver unit responsive to a precharge control signal for supplying a precharge drive signal to said gate electrodes of said at least n-channel enhancement type charging transistors; and said precharge driver unit including:

a series combination of a first n-channel enhancement type compound semiconductor field effect transistor and a second n-channel enhancement type compound semiconductor field effect transistor having a current path coupled between a source of first power voltage level and a source of second power voltage level, a third n-channel enhancement type compound semiconductor field effect transistor having a gate electrode coupled to said source of first power voltage level and a source-and-drain path coupled between an input node for said precharge control signal and a gate electrode of said first n-channel enhancement type compound semiconductor field effect transistor, an inverter having an input node coupled to said input node for said precharge control signal and an output node coupled to a gate electrode of said second n-channel enhancement type compound semiconductor field effect transistor, and a bootstrap capacitor coupled between said gate electrode of said first n-channel enhancement type compound semiconductor field effect transistor and a drain node of said first n-channel enhancement type compound semiconductor field effect transistor for boosting said precharge drive signal.

* * * * *